US007243291B1

(12) United States Patent
Williams

(10) Patent No.: US 7,243,291 B1
(45) Date of Patent: Jul. 10, 2007

(54) SYSTEM AND METHOD FOR COMMUNICATING IMAGE DATA USING ERROR CORRECTION CODING

(75) Inventor: Robert A. Williams, Los Altos, CA (US)

(73) Assignee: Silicon Graphics, Inc., Mountain View, CA (US)

( * ) Notice: Subject to any disclaimer, the term of this patent is extended or adjusted under 35 U.S.C. 154(b) by 470 days.

(21) Appl. No.: 10/137,026

(22) Filed: Apr. 30, 2002

(51) Int. Cl.
*H03M 13/00* (2006.01)

(52) U.S. Cl. ...................................... 714/776; 714/758

(58) Field of Classification Search ................ 714/776, 714/758
See application file for complete search history.

(56) References Cited

U.S. PATENT DOCUMENTS 4,011,511 A * 3/1977 Chang ........................ 375/337
RE30,187 E * 1/1980 Hong et al. ................. 714/758
5,463,643 A * 10/1995 Gaskins et al. ............. 714/766
6,069,899 A * 5/2000 Foley ......................... 370/494
2003/0037342 A1* 2/2003 Pasqualino .................. 725/146

OTHER PUBLICATIONS

Intel DVI, http://netghost.narod.ru/gff/graphics/summary/intdvi.htm.*
Digital Visual Interface, http://www.ce.org/about_cea/cea_initiatives/downloads/dtv/DVI_Informational_Doc_1_04_02.pdf.*

* cited by examiner

*Primary Examiner*—Joseph D. Torres
(74) *Attorney, Agent, or Firm*—Baker Botts L.L.P.

(57) ABSTRACT

A method for communicating video data is provided that includes generating a plurality of error correction code bits and positioning the error correction code bits in a stream of image data such that the stream of image data is encoded. The stream of image data may then be received and encoded in order to convert the stream of image data into a digital visual interface (DVI) format. The stream of image data may then be decoded such that the stream of image data may be displayed in the DVI format. The stream of image data may then be received and checked for one or more errors using the error correction code bits.

20 Claims, 2 Drawing Sheets

| 70a | 70b | 70c | 70d | 70e | 70f |
|---|---|---|---|---|---|
| CHANNEL 0 BITS | CHANNEL 1 BITS | CHANNEL 2 BITS | CHANNEL 3 CHECK BITS | CHANNEL 4 BITS | CHANNEL 5 BITS |
| 6 3 | 4 2 1 0 | 7 5 0 | 7 | 7 6 4 2 | 7 4 0 |
| 6 | 7 5 3 2 1 0 | 2 0 | 6 | 3 2 | 6 4 3 |
| 0 | 6 2 | 6 4 1 0 | 5 | 4 | 3 2 1 |
| 7 4 | 4 3 0 | 7 6 2 1 0 | 4 | 5 3 1 0 | 0 |
| 5 4 2 | 7 6 5 4 2 0 | 7 5 4 2 1 0 | 3 | 7 4 3 2 | 5 3 1 0 |
| 7 5 0 | 2 1 | 7 2 0 | 2 | 5 4 2 1 | 6 5 4 2 |
| 3 1 0 | 7 1 | 5 4 3 2 0 | 1 | 0 | 7 6 4 3 2 |
| 6 4 0 | 7 5 4 3 2 | 6 3 2 1 0 | 0 | 7 6 1 | 0 |

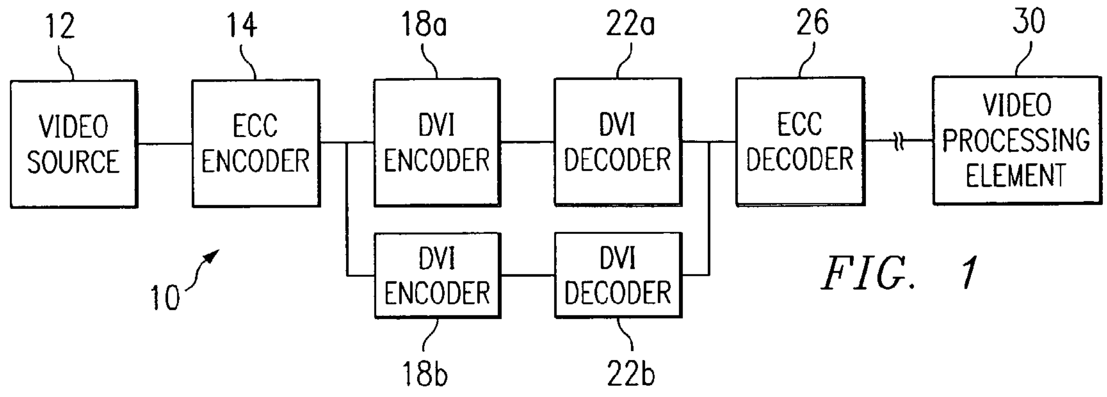
*FIG. 1*
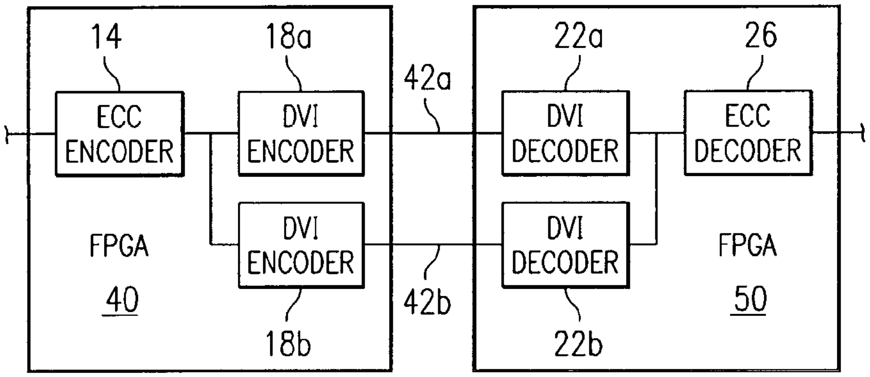
*FIG. 2*
70a 70b 70c 70d 70e 70f
| CHANNEL 0 BITS | CHANNEL 1 BITS | CHANNEL 2 BITS | CHANNEL 3 CHECK BITS | CHANNEL 4 BITS | CHANNEL 5 BITS |
|---|---|---|---|---|---|
| 6 3 | 4 2 1 0 | 7 5 0 | 7 | 7 6 4 2 | 7 4 0 |
| 6 | 7 5 3 2 1 0 | 2 0 | 6 | 3 2 | 6 4 3 |
| 0 | 6 2 | 6 4 1 0 | 5 | 4 | 3 2 1 |
| 7 4 | 4 3 0 | 7 6 2 1 0 | 4 | 5 3 1 0 | 0 |
| 5 4 2 | 7 6 5 4 2 0 | 7 5 4 2 1 0 | 3 | 7 4 3 2 | 5 3 1 0 |
| 7 5 0 | 2 1 | 7 2 0 | 2 | 5 4 2 1 | 6 5 4 2 |
| 3 1 0 | 7 1 | 5 4 3 2 0 | 1 | 0 | 7 6 4 3 2 |
| 6 4 0 | 7 5 4 3 2 | 6 3 2 1 0 | 0 | 7 6 1 | 0 |
*FIG. 3*

SYSTEM AND METHOD FOR COMMUNICATING IMAGE DATA USING ERROR CORRECTION CODING

TECHNICAL FIELD OF THE INVENTION

This invention relates in general to data communications and more particularly to a system and method for communicating image data using error correction coding.

BACKGROUND OF THE INVENTION

Effective data communications are critical for systems attempting to transport information from one point to another. The ability to communicate information while maintaining the integrity and the accuracy of associated data is a significant challenge in many communications environments, including video applications associated with image data propagation. Effective image data communications may form the basis for image quality at a receiving end of a system. Image quality is generally of prime importance in video applications and may represent the performance parameter that most often controls system characteristics and corresponding results.

Where image data is transported without processing, the image data should be generally the same at both source and destination points or nodes. In cases where the image data receives some processing, the original image data should be recoverable at any number of points downstream of the source that originally communicated the image data. Such an objective may be difficult where image data is transported through noisy channels or through poorly functioning components that compromise the integrity of the data or corrupt the transmission of the propagating data. Some deficiencies may be expected or normal, however these errors, glitches, or other defects found in the image data should still be kept to a minimum. Deficiencies in data propagation can cause a number of problems in video environments, most of which may generally result in inadequate image quality caused by faulty data propagation techniques or substandard communication architectures.

SUMMARY OF THE INVENTION

From the foregoing, it may be appreciated by those skilled in the art that a need has arisen for an improved communications approach that insures the capability for the accurate transmission of data from one point to another. In accordance with one embodiment of the present invention, a system and method for communicating image data using error correction coding are provided that substantially eliminate or greatly reduce disadvantages and problems associated with conventional image data communications techniques.

According to one embodiment of the present invention, there is provided a system for communicating image data that includes generating a plurality of error correction code bits and positioning the error correction code bits in a stream of image data such that the stream of image data is encoded. The stream of image data may then be received and encoded in order to convert the stream of image data into a digital visual interface (DVI) format. The stream of image data may then be decoded such that the stream of image data may be displayed in the DVI format. The stream of image data may then be received and checked for one or more errors using the error correction code bits.

Certain embodiments of the present invention may provide a number of technical advantages. For example, according to one embodiment of the present invention, a data communications approach is provided that allows for enhanced image quality as a result of the error correction coding that is included within a stream of image data. The image data that arrives at any suitable reception point may generally comprise a series of pixels that include a minimal number of errors as a result of the error correction coding. The reduction in errors is a result of a data check performed at the receiving point in the architecture. The decrease in the number of errors allows for increased image resolution at a corresponding receiving end, where the image data may be properly received and displayed.

Another technical advantage of one embodiment of the present invention is that image data may be accurately recovered at a suitable reception point of a communications architecture. The integrity of the image data is adequately maintained as the data stream propagates through a corresponding system architecture. The use of error correction coding allows for a receiving entity or node to decipher, interpolate, or otherwise identify the original data transmitted to the receiving end. Thus, with the data being properly recovered at the reception point, the data may be suitably processed or otherwise communicated to a next destination. Embodiments of the present invention may enjoy some, all, or none of these advantages. Other technical advantages may be readily apparent to one skilled in the art from the following figures, description, and claims.

BRIEF DESCRIPTION OF THE DRAWINGS

To provide a more complete understanding of the present invention and features and advantages thereof, reference is made to the following description, taken in conjunction with the accompanying figures, wherein like reference numerals represent like parts, in which:

FIG. 1 is a simplified block diagram of a communication system for communicating image data using error correction coding;

FIG. 2 is a simplified block diagram of one embodiment of the present invention in which multiple field programmable gate arrays (FPGAs) are used to implement a system for communicating image data using error correction coding;

FIG. 3 is a table illustrating example channel assignments and corresponding parity bits associated with the communication system of FIG. 1.

DETAILED DESCRIPTION OF THE INVENTION

Figure 4:
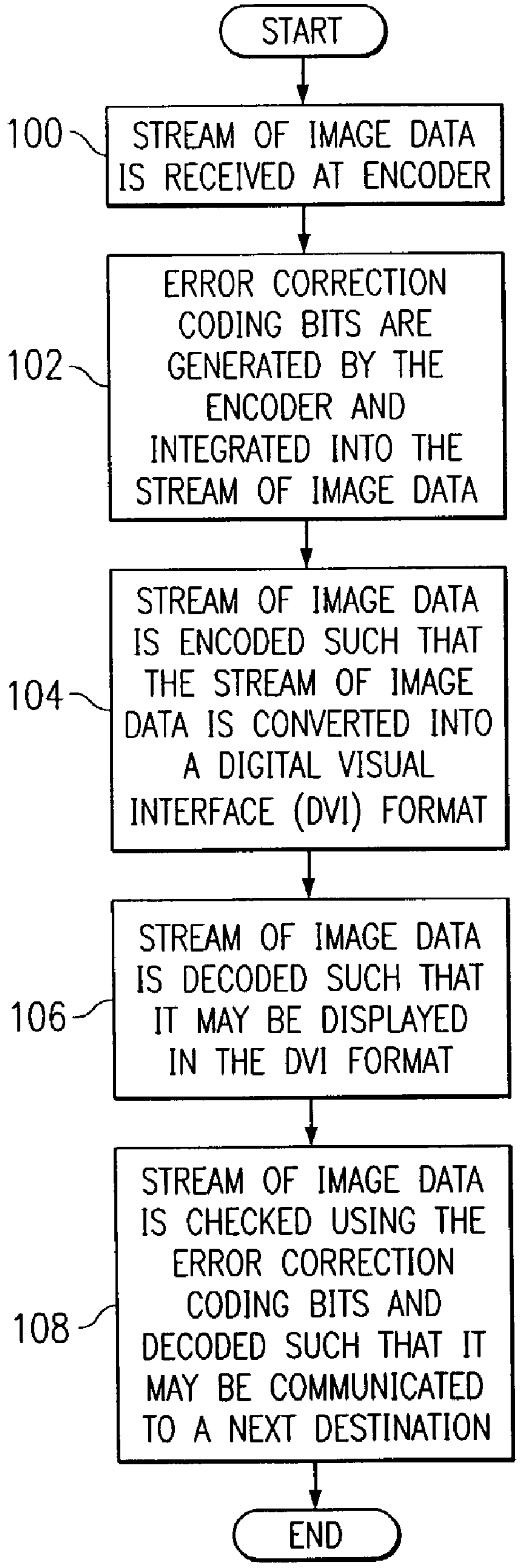
FIG. 4 is a flow chart illustrating a series of steps associated with a method for communicating image data using error correction coding.

FIG. 1 is a simplified block diagram of a communication system 10 for communicating image data using error correction coding. Communication system 10 includes a video source 12, an error correction coding (ECC) encoder 14, a set of digital visual interface (DVI) encoders 18*a* and 18*b*, a set of DVI decoders 22*a* and 22*b*, an ECC decoder 26, and a video processing element 30. Communication system 10 provides an environment in which a stream of image data may be communicated from video source 12 to ECC decoder 26 in a manner such that the image data is delivered to a suitable reception point where it may be properly checked for accuracy.

In a particular embodiment of the present invention, ECC encoder 14 generates a plurality of check bits that are integrated into a stream of image data propagating through communication system 10. ECC encoder 14 may then communicate the image data stream to a next destination such that the error correction coding propagates concurrently with the image data stream. The combination of the image data stream and error correction coding may propagate through various elements of communication system 10 before reaching ECC decoder 26. ECC decoder 26 may then perform a check sum of the received bits or otherwise evaluate the incoming information such that it may be determined whether or not an error has occurred in the transmission, reception, or the propagation of the image data. ECC decoder 26 provides a data checking function to communication system 10 at a receiving end of the architecture, whereby the original data communicated by video source 12 may be recovered accurately at ECC decoder 26 before being communicated to a next destination, such as video processing element 30, for example.

The error correction coding function provides for the reliable and accurate transmission and reception of image data. This in turn may result in increased resolution or enhanced image quality at any element, object, or device the receives the checked image data stream. This may be particularly important in video applications or environments where error rates must be kept to a minimum. In addition, the use of ECC encoder 14 and ECC decoder 26 in a video environment operates to ensure that errors are identified quickly and subsequently remedied before potentially deficient or incorrect image data is communicated to a next element in a corresponding architecture. Without the use of such error correction coding, a corresponding system could generate an error and then, through the transmission or the communication of the image data, magnify or otherwise exacerbate the originally generated error or flaw in the communication. Thus, in accordance with the teachings of the present invention, an error correction coding operation may be performed in order to ensure that defects found in the image data are cured quickly after being detected.

Video source 12 is an element that generates image data to be communicated to ECC encoder 14. In a particular embodiment of the present invention, video source 12 generates 24-bit RGB (red, green, blue) data that is communicated to ECC encoder 14. Alternatively, video source 12 may generate data of any suitable bit size or length where appropriate such that image information is adequately communicated to ECC encoder 14. Video source 12 may include any hardware, software, object, element, or component operable to generate, receive, or facilitate the delivery of image data to ECC encoder 14. For example, video source 12 may be a buffer or a data storage unit that selectively delivers image data from one point to ECC encoder 14.

In a particular embodiment of the present invention, the image data stream generated or otherwise communicated by video source 12 is pixel data which may include RGB image information segments. The error correction coding may then be infused, inserted, added, or otherwise integrated with the pixel data. Alternatively, the image data stream communicated by video source 12 could be any suitable piece of information or data in any appropriate format. Data as used herein in this document refers to any type of numeric, voice, or script data (inclusive of object code, source code, or instruction code), or any other suitable information in any appropriate format that may be communicated from one point to another.

A pixel is a unit of image data that may be combined with additional elements in order to form a picture element. The memory bits associated with a single grid location in a frame buffer generally constitute a single pixel. Each pixel generally corresponds to a 1.0 by 1.0 screen area unit. Using the example of a color computer screen for purposes of teaching, corresponding hardware causes each pixel on the screen to emit different amounts of red, green and blue light. These are called R, G, and B values (as identified above), which may be packed together possibly with an alpha value ('A'), whereby the packed value may be referred to as an RGB value or an RGBA value. There are two modes to store information of a pixel on the screen. They may be in a color index mode or an RGBA mode. In the color index mode, each pixel represents a single number called the color index used to illustrate the color of the pixel. Each color index may indicate an entry in a table or a color map that defines a particular set of R, G, and B values. In the RGBA mode, each pixel has its individual R, G, B, and possibly A values. These values may be kept for each pixel in a suitable color buffer. A video screen, monitor, or display is composed of a set of pixels. Each pixel may display a tiny square of color at a fixed location in an image on the screen. Information about each pixel is used in order to draw the pixel properly. Each pixel requires the same size of storage generally to store the information.

The pixel data communicated by video source 12 may be sent over transition minimized differential signaling (TMDS) wires where appropriate. A color depth of 24-bit RGB pixels may generally follow a DVI protocol for both single and dual link up to 200 Mpix/s. This protocol may be designated by internal processing constraints, limitations associated with a system architecture, or selected based on compatibility or performance characteristics. Video source 12 may also deliver image data to ECC encoder 14 via two separate single-link connections, via suitable cables or wires where appropriate, or over a single transmission link element.

DVI represents an example communication protocol that provides proper formatting and suitable processing of image data in video applications. DVI architectures may generally be designed for two TMDS links. Each of the TMDS links may be composed of three data channels for communicating RGB information. Additionally, each of the TMDS links may have a bandwidth in the range of approximately 150–200 megahertz (MHz), which equates to approximately 150–200 million pixels per second being communicated. Alternatively, TMDS links may have a bandwidth in any other suitable range, communicating pixels at an appropriate corresponding flow rate. The bandwidth required for a given resolution may be determined by the refresh rate and the blanking interval of an associated monitor or display. An approximation of bandwidth may be calculated by multiplying the resolution value by the refresh rate and multiplying that value by the equation: (1+blanking interval) in order to generate a pixel per second value for various implementations of communication system 10.

ECC encoder 14 is an error correction element that generates a series of check bits that may be integrated with, inserted into, or otherwise added to an incoming image data stream received from video source 12. ECC encoder 14 may include any hardware, software, object, device, or element operable to insert or position error detection or error correction information into an incoming data stream. Alternatively, ECC encoder 14 may transform the image data as it propagates through communication system 10 such that any suitable error correction object or element is provided to the image data stream.

ECC encoder 14 may include an algorithm such that an error correction function is provided to incoming image data that is subsequently checked by ECC decoder 26. In a particular embodiment, ECC encoder 14 may include a logic algorithm, whereby a forty-bit pattern of incoming information may receive an additional eight ECC bits based on the incoming forty bits. Thus, any suitable algorithm, equation, formula, routine, or program may be designated or stored in ECC encoder 14 (or implemented in conjunction with ECC encoder 14) that specifies a manner of deriving the eight check bits from the forty bits that are received. A suitable program may be used to match or otherwise map the eight bits to the forty bits propagating through communication system 10. In alternative embodiments of the present invention, 36-bit patterns, 24-bit patterns, or any other suitable pattern width of information or data may be received by ECC encoder 14 and assigned or designated a suitable number of error correction or error detection check bits.

As described above, ECC encoder 14 may accommodate image data streams that are larger than a 24-bit RGB image data stream. Accordingly, ECC encoder 14 may also accept more bits per component, and may additionally receive an alpha channel input where appropriate, and any suitable number of error correction or error detection bits. The most significant bits of the RGB pixel data stream may be provided over a primary TMDS link in accordance with a particular embodiment of the present invention. However, any other suitable bit communications format may be used according to particular needs.

In operation, ECC encoder 14 provides a checking function for data being communicated between two points in communication system 10. ECC operations or error detection code operations invoked by ECC encoder 14 allow data that is being communicated through communication system 10 to be checked for errors and, in certain scenarios, properly corrected. Parity checking operations may also be used in conjunction with ECC encoder 14. When a unit of data or word is stored or otherwise held in ECC encoder 14 prior to communication, an error correction code sequence that describes the bit sequence in the word may be generated or calculated and stored along with the unit of image data. For each image data bit segment or word, an extra suitable number of bits may be used to store this code. When the unit of image data is requested for reading at a suitable reception point, a code for the stored (and about to be read) word may be calculated again using an ECC algorithm or any other suitable protocol, program, or routine. The newly generated code may be compared with the code generated when the word was stored. Where the codes match at a reception point, such as ECC decoder 26 for example, it may be determined whether the data is free of errors. If the codes do not match, the missing or erroneous bits are determined through the code comparison and the bits or bit that are in error may be supplied or otherwise corrected. If the codes match, the image data may be communicated to any suitable next destination.

DVI encoders 18*a* and 18*b* are each coupled to ECC encoder 14 and operate to encode the image data that they receive. DVI encoders 18*a* and 18*b* may each receive a portion of the image data communicated by ECC encoder 14 or alternatively the entire image data stream may be directed to any one of DVI encoders 18*a* and 18*b*. DVI encoders 18*a* and 18*b* may convert the image data received into a code or a suitable digital signal that may be compatible with a DVI protocol for later displaying or processing in a DVI environment or application. DVI encoders 18*a* and 18*b* may each include any hardware, software, object, or element operable to provide an encoding function to data received from ECC encoder 14.

The DVI specification as described above may support hot plugging of DVI display devices or elements. The DVI specification may also support the implementation of other communications elements, such as: the video electronic standards association (VESA) display data channel/command interface standard (DDC/CI) and the extended display identification data (EDID) standard. EDID is a standard data format that may include monitor information such as: vendor information, monitor timing, maximum image size, and color characteristics, for example. EDID information may be suitably stored, displayed, and communicated over the DDC standard. Both EDID and DDC may enable communication system 10, a corresponding display or monitor, a graphics adapter, or any other suitable element to communicate such that communication system 10 is configured to support specific features available in the display or monitor.

Suitable digital DVI connectors having a requisite number of pins may accommodate the VESA, DDC, and EDID protocols and two TMDS links. The DVI specification generally defines two types of connectors: a DVI-digital connector that supports digital displays and a DVI-integrated connector that supports digital displays and which is also compatible with analog displays.

DVI decoders 22*a* and 22*b* receive image data from DVI encoder 18*a* and DVI encoder 18*b* respectively. DVI decoders 22*a* and 22*b* may decode the incoming image data such that the image data may be suitably displayed or otherwise communicated in a DVI environment or application. DVI decoders 22*a* and 22*b* may transform or otherwise modify the stream of image data or a digital signal into an analog format. DVI decoders 22*a* and 22*b* may each include any hardware, software, object, element or component operable to decode incoming image data such that it may be communicated or adequately displayed in DVI applications. After suitable decoding of the incoming data stream, DVI decoders 22*a* and 22*b* may each communicate respective portions of the decoded image data to ECC decoder 26.

ECC decoder 26 is a decoding element or unit that receives an incoming image data stream from either DVI decoder 22*a* or DVI decoder 22*b* (or both) and performs a check on the incoming data. ECC decoder 26 cooperates with ECC encoder 14 in order to deliver highly accurate data to a next destination, such as video processing element 30. ECC decoder 26 analyzes the check bits and corresponding data payload communicated through communication system 10 and identifies whether or not an error has occurred in the reception, transmission, or propagation of the image data.

ECC decoder 26 may also include elements operable to decipher which type of error occurred in the transmission of data signal that an error has occurred and that potential retransmission of the original image data may be appropriate. ECC decoder 26 may also operate to correct or otherwise modify data that includes a defect such that accurate information may be properly communicated to a next destination. Additionally, ECC decoder 26 may recover the original data communicated by video source 12 such that it may be further processed by any suitable device, component, element, or object included within or external to communication system 10. In a particular embodiment of the present invention, after ECC decoder 26 performs a suitable decoding function to the incoming image data, suitable pixel-processing may be performed in order to convert the image data into a video format which may then be communicated or 'looped' through any suitable device such for example as a monitor.

The error correction bits that are checked by ECC decoder 26 offer a tool that allows for the correction of bits that are in error. For example, eight error correction bits may provide for the error correction of one serial bit in error of the six serial channels over a dual link that may be transporting a total of forty-eight bits. Accordingly, single-bit errors over serialized links may be corrected while the data sent over these links receives eight to ten-bit encoding. Because single-bit errors cannot be directly accessed and therefore directly corrected, single-bit errors may be corrected indirectly on parallel data after suitable TMDS decoding processes. The associated decoding algorithm may operate to convert the possible sixty single-bit error patterns over the serial link into sixty error patterns on the parallel side of the link. Accordingly, ECC check bits may be chosen to correct the particular sixty parallel patterns in an example embodiment of the present invention. The error correction bits may be set in accordance with the table as illustrated in FIG. 3, discussed in greater detail below with reference thereto.

In operation, eight unused bits of a data transport may be reserved and set to zero or may alternatively be used to transport up to forty-eight bit RGBA or double resolution twenty-four bit RGB data. The forty-eight bits of image data that is transported may be divided into four twelve-bit words. In the case of the twenty-four bit RGB data implementation, the use of single link communications may be appropriate, whereby two twelve-bit words are transported instead of four twelve-bit words. By adding four check bits or pixels at the end of each line, one or more image data pixel errors per line may be corrected, whereby the line length may be approximately 4,092 pixels (or less or greater according to particular needs). This method may operate to reduce the error rate to approximately 1.0E−17. ECC decoder 26 may remove or discard the extra check bits where appropriate or transport the entire image data stream (inclusive of the error correction bits) to a next destination. ECC decoder 26 may insert additional error correction code bits into the received image data stream after executing the parity check or ECC decoder 26 may be coupled to any suitable element operable to perform this operation.

Video processing element 30 is a reception node that operates to receive the image data communicated by ECC decoder 26. Video processing element 30 may be any suitable video component, object, or element used in any video environment. For example, video processing element 30 may be a line-doubler or an up-converter used to increase the resolution of incoming image data. Video processing element 30 may also be a biasing element or a filter used to further modify an incoming image data stream. Video processing element 30 may also be an image enhancement component, an image processing element, or an image generating or displaying element (where the image that is generated or displayed is based on the stream of image data). Alternatively, video processing element 30 may be any video component, such as a camera, monitor, display, or any other suitable element operable to receive and further process the incoming image data stream.

Communication system 10 may capitalize on the use of extra available wires that may be external to elements such as DVI encoders 18*a* and 18*b*, or ECC encoder 14, for example. This availability may be due to an alpha channel input, which requires a second cable that is used to communicate information therethrough. Accordingly, error correction coding bits may be sent over the alpha channel input where appropriate such that if an error is generated, the original data may be recovered and/or the error detected at ECC decoder 26.

Because the basic pixel error rate of standard DVI transmissions is 1.0E−9 (approximately one pixel every ten seconds), the ECC operation provided by communication system 10 may significantly ameliorate error rates for image data propagation. With particular reference to video applications, an ECC operation may provide enhanced image quality and increased accuracy in the manner in which data is communicated or delivered. In addition, the ECC operation may offer the ability to correct errors easily before they are compounded or otherwise made more egregious when incorrect image data is processed or communicated to a next destination.

FIG. 2 is a simplified block diagram of a field programmable gate array (FPGA) 40 and an additional FPGA 50 used to implement the error correction coding operation in accordance with one embodiment of the present invention. FPGA 40 may include ECC encoder 14, DVI encoder 18*a* and DVI encoder 18*b*. Additionally, FPGA 50 may include DVI decoder 22*a*, DVI decoder 22*b*, and ECC decoder 26. FPGA 40 and FPGA 50 may be coupled to each other via a set of communication links 42*a* and 42*b*. Communication links 42*a* and 42*b* may be cable wires in a particular embodiment of the present invention or any other suitable communications element or interface that is operable to facilitate communications between FPGA 40 and FPGA 50 to include-wireless and fiber optic links.

FPGAs 40 and 50 may be used for the implementation of error correction coding in any number of suitable configurations. FIG. 2 illustrates one example configuration in which communication system 10 is broken up into two FPGAs 40 and 50 that are operable to execute error correction encoding and error correction decoding respectively. Where communication system 10 is implemented in conjunction with FPGA 40 and FPGA 50, the associated FPGA firmware may be written in verilog or in any other suitable communication language. FPGA 40 and FPGA 50 may also each include a simulation test element to verify proper operation and to assist in trouble shooting where appropriate.

Alternatively, FPGA 40 and FPGA 50 may be replaced by any other suitable element or device operable to provide an environment, arrangement, architecture, or configuration for executing error correction coding within communication system 10. For example, FPGA 40 and FPGA 50 may be an erasable programmable read-only memory (EPROM), an electrically erasable programmable read-only memory (EEPROM), a general purpose central processing unit (CPU), a PROM, a ROM, a random access memory (RAM) element, a microprocessor, a microcontroller, or any other suitable software, hardware, object, or element operable to facilitate the operation and implementation of error correction coding.

FIG. 3 is a table that defines a parity example for each one of the eight check bits communicated via six channels. The channel bits are indicated generally at 70*a–f*. Each channel may include a setting, designation, or assignment for odd or even parity such that an unexpected result received at a reception node may be identified when an error has occurred. For purposes of example, even parity has been illustrated in the table of FIG. 3. The table describes error correction bits that propagate over channels 0–5 and are used to perform the encoding function provided to communication system 10.

Error correction code bits, such as those illustrated in the table of FIG. 3, may be used to compensate for the corruption that may occur in communications over imperfect channels. Check bits 70*d* ensure the accurate delivery of an image data stream that propagates to a receiving element or device in communication system 10. In a particular embodiment of the present invention, six DVI channels of dual links may be defined such that channels 0–5 represent six channels of the dual link with each channel receiving eight bits in accordance with a DVI protocol. In the example provided in the table of FIG. 3, the eight ECC bits are provided on channel three (70*d*) and are set to create even parity.

In the example shown each channel includes eight bits. Channels 0, 1, and 2 preferably carry red, green, and blue data respectively. Channel 5 may carry alpha data while channel 4 may carry extra red, green, blue, and alpha data to extend the data transport capability. Various combination of bits from each of channels 0, 1, 2, 4, and 5 are used to set each check bit in channel 3. For example, check bit 7 of channel 3 is set in response to bits 6 and 3 of channel 0; bits 4, 2, 1 and 0 of channel 1; bits 7, 5, and 0 of channel 12; bits 7, 6, 4, and 2 of channel 4; and bits 7, 4, and 0 of channel 5 to provide even parity. The table of FIG. 3 shows which bits are selected and used to set each check bit in channel 3. Though a specific example is shown, any combination of bits from channels 0, 1, 2, 4 and 5 may be selected and used to set each check bit of channel 3.

The table illustrated in FIG. 3 further illustrates the partial operation of ECC encoder 14. ECC decoder 26 may then perform the corresponding check based on the error correction bits in order to ensure that no errors have been generated as the image data stream propagated through communication system 10. In the example implementation of FIG. 3, if the parity associated with all of the bits is even, then it may be presumed that no errors were found in the communication of the image data. However, in the case where the parity is not even for the even parity check implemented, the result identifies an error that may be present in the image data stream. Based on such a result, a syndrome or any other suitable element may be created that provides an eight-bit value for the eight parity checks in the example offered in the table. Sixty of the possible two-hundred fifty-five non-zero syndrome patterns may indicate which bits are in error. Such errors may be identified or characterized by type and subsequently inverted, modified, or otherwise remedied in order to correct, remove, or discard the errors. All remaining non-zero syndromes may indicate uncorrectable errors and may accordingly be flagged as such.

Subsequent decoding may be performed in any number of suitable ways after the error correction bits are properly positioned into the stream of image data as described above. Decoding protocols implemented by ECC decoder 26 may correlate to the application implemented in conjunction with ECC encoder 14. If provided with original bits of image data, and all of the parity bits, the syndrome generator may operate as a parity checker where the result of the parity checker may indicate where an error has occurred and whether or not that error is fixable.

In operation, the stream of image data may be integrated with the error correction coding bits of the table of FIG. 3 in any number of suitable fashions. In accordance with one embodiment of the present invention, communication system 10 may capitalize on eight unused bits of transport data. Eight check bits per pixel may be generated and transmitted over the links or channels and decoded at a receiving portion or reception node of the corresponding architecture. Properly chosen check bits may correct any single-bit error and detect multiple-bit errors over the transport or propagation of information or data.

It is important to note that communication system 10 offers considerable flexibility in its implementation in that it may be implemented in conjunction with any number of suitable error correcting or error detecting protocols. For example, in accordance with one embodiment of the present invention, a selected amount of error correcting code may be added by any suitable element within communication system 10 in order to insert check bits into the stream of image data from a Bose-Chaudhuri-Hochquenghem (BCH) type code, for example, such as a Reed-Solomon code. BCH code represents an example implementation where a multilevel, cyclic, error-correcting, variable-length digital code is used to correct errors. BCH codes are not limited to binary codes and may be used with multilevel phase-shift keying when the number of levels is a prime number or a power of a prime number, such as 2, 3, 4, 5, 7, 8, 11, 13, etc. A BCH code in eleven levels may be used where appropriate to represent the ten decimal digits and a sign digit.

Reed-Solomon codes are blocked-based error correcting codes with a wide range of applications in digital communications. A Reed-Solomon encoder may take a block of digital data and add extra redundant bits. The corresponding decoder may process each block in an attempt to correct errors and to recover the original data. The number and the type of errors that can be corrected depends on the Reed-Solomon code being implemented. Reed-Solomon codes represent a subset of BCH codes that are linear blocked codes. Reed-Solomon codes may be shortened by making a number of data symbols equal to zero at the encoder or by not transmitting certain data symbols and then retransmitting or inserting them at a corresponding decoder. The amount of processing or power required to encode and decode Reed-Solomon codes may be directly related to the number of parity symbols per code word. A large value of symbols to be corrected translates into a large number of errors that can be corrected.

Communication system 10 may be applied in a number of video applications. For example, communication system 10 may be implemented with use in still pictures for graphic interchange format (GIF) elements or in joint photographic experts group (JPEG) elements that can be used to display images. In addition, communication system 10 may be used in video conferencing or progressive scanning videos. In progressive scanning, the first line may be displayed on a corresponding monitor, then the second, then the third, and so forth until the frame is completely painted with image data or pixels. In addition, communication system 10 may be used in conjunction with interlace presentations, which may operate to display odd numbered lines first.

Communication system 10 may additionally be used in the context of high-definition television. High-definition television (HDTV) refers to a series of standards that define finer or higher resolution digital television. Additionally, communication system 10 may be used in conjunction with moving picture experts group (MPEG) elements. Alternatively, communication system 10 may be used in any other video applications or communications environments where image data is sought to be accurately communicated from one point to another.

FIG. 4 is a simplified flowchart illustrating a series of steps associated with a method for communicating image data in accordance with one embodiment of the present invention. The method starts at step 100 where a stream of image data may be received at ECC encoder 14. The stream of image data may be generated or communicated by video source 12 or by any other suitable element, component, or object operable to provide the stream of image data to ECC encoder 14. At step 102, error correction coding bits are generated or received by ECC encoder 14 and integrated or suitably positioned into the stream of image data. The stream of image data may then be properly encoded by DVI encoders 18*a* and 18*b* such that the stream of image data is converted into a DVI format. As illustrated by step 104, suitable portions of the image data stream may be divided or otherwise sectioned such that each of DVI encoders 18*a* and 18*b* may receive some, all, or none of the image data.

At step 106, the stream of image data may be decoded by DVI decoders 22*a* and 22*b* such that the stream of image data may be adequately displayed in the DVI format. As explained above, DVI decoders 22*a* and 22*b* may similarly receive some, all, or none of the image data, which is communicated by DVI encoders 18*a* and/or 18*b*. At step 108, the stream of image data may be checked using the error correction coding bits and decoded by ECC decoder 26 such that it may be communicated to a next destination. ECC decoder 26 may perform a parity check or any other suitable error checking protocol in order to verify that the image data has been properly and accurately communicated through communication system 10. Once the stream of image data has been suitably decoded by ECC decoder 26 and the error correction operation performed, the stream of image data may be communicated to any suitable next destination, such as for example video processing element 30.

Although the present invention has been described in detail with reference to particular embodiments, it should be understood that various other changes, substitutions, and alterations may be made thereto without departing from the spirit and scope of the present invention. For example, although the present invention has been described as operating in conjunction with image data, any suitable data in various video applications may benefit from the teachings of the present invention. Data in any format may be processed by communication system 10 such that error correction coding is integrated in the data stream. The error correction coding provides a feature for checking the delivery of the information at any suitable receiving portion of the designated system.

Additionally, although the present invention has been described with reference to error correction coding, the present invention encompasses other data integrity or data checking elements that operate to ensure proper and accurate delivery of information. For example, error detection code or error correction algorithms may be implemented in conjunction with communication system 10 without departing from the scope of the present invention. The error correction or error detection elements function to facilitate the accurate propagation of information from one point to another in an associated system or architecture. Numerous other changes, substitutions, variations, alterations, and modifications may be ascertained by those skilled in the art and it is intended that the present invention encompass all such changes, substitutions, variations, alterations, and modifications as falling within the spirit and scope of the appended claims.

Moreover, any statement in the specification is not intended in any way to limit the present invention that is not otherwise reflected in the appended claims.

What is claimed is:

1. An apparatus for communicating image data, the apparatus comprising:

an error correction coding (ECC) encoder operable to generate a plurality of error correction code bits, the ECC encoder positioning the error correction code bits in a stream of image data such that the stream of image data is encoded, the stream of image data being carried over a plurality of channels;

a digital visual interface (DVI) encoder coupled to the ECC encoder and operable to receive the stream of image data from the ECC encoder and to encode the stream of image data in order to convert each channel of the stream of image data into a DVI format, the plurality of channels including a plurality of data channels each carrying a plurality of data bits and an ECC channel carrying the plurality of error correction code bits, each of the plurality of error correction code bits being generated by the ECC encoder using various combinations of a plurality of data bits from each of the plurality of data channels whereby each error correction code bit is generated from groups of bits selected from the plurality of data bits for each channel, and whereby each group comprises various bits selected from the plurality of data bits for each of the data channel.

2. The apparatus of claim 1, further comprising:

an additional DVI encoder coupled to the ECC encoder and operable to receive a portion of the stream of image data, the additional DVI encoder being further operable to encode the portion of the stream of image data in order to convert the portion of the stream of image data into the DVI format.

3. The apparatus of claim 1, further comprising:

a DVI decoder operable to receive the stream of image data from the DVI encoder and to decode the stream of image data such that the stream of image data may be displayed in the DVI format; and an ECC decoder operable to receive the stream of image data from the DVI decoder and to check the stream of image data for one or more errors using the error correction code bits, the ECC decoder being further operable to decode the stream of image data such that the stream of image data may be communicated to a next destination after it is checked.

4. The apparatus of claim 3, further comprising:

a video processing element operable to receive the stream of image data from the ECC decoder and to process the stream of image data, wherein the stream of image data is checked by the ECC decoder for one or more errors by executing a parity check that uses the error correction code bits.

5. The apparatus of claim 4, further comprising:

a monitor operable to receive the stream of image data from the video processing element and to display an image based on the stream of image data.

6. The apparatus of claim 3, further comprising:

a first field programmable gate array (FPGA), the FPGA including the ECC encoder and the DVI encoder;

a second FPGA coupled to the FPGA, the additional FPGA including the DVI decoder and the ECC decoder.

7. The apparatus of claim 1, further comprising:

a video source coupled to the ECC encoder and operable to communicate the stream of image data to the ECC encoder, wherein the stream of image data comprises pixel data.

8. The apparatus of claim 1, further comprising:

an alpha channel coupled to the ECC encoder and operable to facilitate propagation of the error correction code bits along the alpha channel.

9. A method for communicating image data, the method comprising:

generating a plurality of error correction code bits;

positioning the error correction code bits in a stream of image data such that the stream of image data is encoded, the stream of image data being carried over a plurality of channels;

receiving the stream of image data and encoding the stream of image data in order to convert each channel of the stream of image data into a digital visual interface (DVI) format, the plurality of channels including a plurality of data channels each carrying a plurality of data bits and an ECC channel carrying the plurality of error correction code bits, each of the plurality of error correction code bits being generated using various combinations of a plurality of data bits associated with each of the plurality of data channels whereby each error correction code bit is generated from groups of bits selected from the plurality of data bits for each channel, and whereby each group comprises various bits selected from the plurality of data bits for each of the data channels.

10. The method of claim 9, further comprising:

receiving a portion of the stream of image data; and encoding a portion of the stream of image data in order to convert the portion of the stream of image data into the DVI format.

11. The method of claim 9, further comprising:

decoding the stream of image data such that it may be displayed in the DVI format; and receiving the stream of image data and checking the stream of image data for one or more errors using the error correction code bits.

12. The method of claim 11, wherein the stream of image data is checked for one or more errors by executing a parity check that uses the error correction code bits, and wherein the stream of image data comprises pixel data.

13. The method of claim 11, further comprising:

receiving the stream of image data after it is processed; and displaying an image that is based on the stream of image data.

14. The method of claim 9, further comprising:

communicating the error correction code bits along an alpha channel such that the error correction code bits may be positioned in the stream of image data and the stream of image data may be encoded.

15. A computer readable medium having code for communicating image data, the code operable to:

generate a plurality of error correction code bits;

position the error correction code bits in a stream of image data such that the stream of image data is encoded, the stream of image data being carried over a plurality of channels;

receive the stream of image data and encode the stream of image data in order to convert each channel of the stream of image data into a digital visual interface (DVI) format, the plurality of channels including a plurality of data channels each carrying a plurality of data bits and an ECC channel carrying the plurality of error correction code bits, each of the plurality of error correction code bits being generated using various combinations of a plurality of data bits associated with each of the plurality of data channels whereby each error correction code bit is generated from groups of bits selected from the plurality of data bits for each channel, and whereby each group comprises various bits selected from the plurality of data bits for each of the data channels.

16. The code of claim 15, further operable to:

receive a portion of the stream of image data; and encode a portion of the stream of image data in order to convert the portion of the stream of image data into the DVI format.

17. The code of claim 15, further operable to:

decode the stream of image data such that it may be displayed in the DVI format; and receive the stream of image data and check the stream of image data for one or more errors using the error correction code bits.

18. The code of claim 17, wherein the stream of image data is checked for one or more errors by executing a parity check that uses the error correction code bits, and wherein the stream of image data comprises pixel data.

19. The code of claim 17, further operable to:

process the stream of image data in order to enhance image resolution associated with the stream of image data; and display an image that is based on the stream of image data.

20. The code of claim 15, further operable to:

communicate the error correction code bits along an alpha channel such that the error correction code bits may be positioned in the stream of image data and the stream of image data may be encoded.

* * * * *